(12) United States Patent
Schmieder et al.

(10) Patent No.: US 9,273,784 B2
(45) Date of Patent: Mar. 1, 2016

(54) VALVE FOR METERING FLUID

(71) Applicants: Dietmar Schmieder, Markgroeningen (DE); Timo Kegel, Memmelsdorf (DE)

(72) Inventors: Dietmar Schmieder, Markgroeningen (DE); Timo Kegel, Memmelsdorf (DE)

(73) Assignee: ROBERT BOSCH GMBH, Stuttgart (DE)

( * ) Notice: Subject to any disclaimer, the term of this patent is extended or adjusted under 35 U.S.C. 154(b) by 268 days.

(21) Appl. No.: 13/948,657

(22) Filed: Jul. 23, 2013

(65) Prior Publication Data

US 2014/0021387 A1    Jan. 23, 2014

(30) Foreign Application Priority Data

Jul. 23, 2012   (DE) .................... 20 2012 007 128 U

(51) Int. Cl.
| | |
|---|---|
| *H01L 41/04* | (2006.01) |
| *F16K 7/04* | (2006.01) |
| *F02M 51/00* | (2006.01) |
| *F02M 63/00* | (2006.01) |
| *H01L 41/047* | (2006.01) |
| *H01L 41/053* | (2006.01) |
| *H01L 41/083* | (2006.01) |

(52) U.S. Cl.
CPC .............. *F16K 7/045* (2013.01); *F02M 51/005* (2013.01); *F02M 63/0026* (2013.01); *H01L 41/0475* (2013.01); *H01L 41/0536* (2013.01); *H01L 41/083* (2013.01)

(58) Field of Classification Search
CPC H01L 41/083; H01L 41/0536; F02M 51/005; F16K 7/045

USPC .................................................. 310/328, 365
See application file for complete search history.

(56) References Cited

U.S. PATENT DOCUMENTS

| | | | | |
|---|---|---|---|---|
| 2005/0006495 | A1* | 1/2005 | Schurz ................. | F02M 51/005 239/102.2 |
| 2005/0041073 | A1* | 2/2005 | Fontaine ................ | B41J 2/0452 347/68 |
| 2005/0151445 | A1* | 7/2005 | Titschert ............... | H01L 41/042 310/316.03 |
| 2006/0038032 | A1* | 2/2006 | Plecher ................ | F02M 51/005 239/102.2 |
| 2007/0096375 | A1* | 5/2007 | Stier .................. | F02M 51/0603 267/167 |
| 2008/0191065 | A1* | 8/2008 | Zumstrull ............. | H01L 41/053 239/533.11 |
| 2008/0265805 | A1* | 10/2008 | Pirkl ................... | F02D 41/2096 318/116 |
| 2011/0309164 | A1* | 12/2011 | Schmieder ......... | F02M 51/0603 239/533.2 |
| 2014/0132113 | A1* | 5/2014 | Grohmann ............. | H02N 2/065 310/317 |

FOREIGN PATENT DOCUMENTS

| | | | | |
|---|---|---|---|---|
| DE | 10319599 | | 11/2004 | |
| DE | 1577960 | A1 * | 9/2005 | ........... F02M 51/005 |
| DE | 102007028490 | | 12/2008 | |
| DE | 102009027101 | A1 * | 12/2009 | ............ H01L 41/053 |
| EP | 1577960 | A1 * | 9/2005 | ............ H01L 41/053 |
| JP | 01012880 | A * | 1/1989 | |

* cited by examiner

*Primary Examiner* — J. San Martin
(74) *Attorney, Agent, or Firm* — Kenyon & Kenyon LLP

(57) ABSTRACT

A valve for metering fluid includes: a piezoelectric actuator for metering control; two electrical connection elements for applying an electrical control voltage; and a discharge resistor integrated into the actuator, which resistor bridges the two connection elements.

6 Claims, 1 Drawing Sheet

VALVE FOR METERING FLUID

BACKGROUND OF THE INVENTION

1. Field of the Invention

The present invention relates to a valve for metering fluid.

2. Description of the Related Art

The umbrella term 'fluid' for a liquid or flowing medium is used for gases and liquids in conformity with the teaching of hydrodynamics.

Metering valves having piezoelectric actuators make use of the piezoelectric effect of a so-called piezo module. One known piezo module for a piezo-controlled fuel injector (published German patent application document DE 103 19 599 A1) has a stack of individual piezoelectric elements situated axially one behind the other, which are connected to two contact pins, as well as two cover plates situated at the end faces of the stack; in addition, it has a bourdon tube which engages at the connection plates and generates an axial pressure force on the stack by way of the cover plates in response to the application of an electric voltage at the contact pins. The stack, which is under axial pressure, becomes longer when an electric voltage is applied at the contact pins. The elongation is employed to generate an opening lift of a valve member that controls a metering orifice of the metering valve. The size of the opening lift and the opening time of the valve member define the metered fluid quantity. Such a piezo module, supplemented by an electrical connection to form a piezoelectric actuator, is installed, together with the valve member and a hydraulic coupler, in force-locking manner in a switching force chain of the valve that is acting on the valve member, as described in published German patent application document DE 10 2007 028 490 A1, for example. In order to minimize the tolerances in the metering precision of the valve, it is extremely important that the force relationships in the switching force chain be adjustable in a highly precise manner. This requires a defined initial length of the actuator. However, the length of the piezo module, and thus the length of the actuator, may vary as a result of the piezoelectric effect triggered by temperature fluctuations during storage or by mechanical loading of the actuator during prior work processes; for this reason, to produce the defined initial length of the actuator, the actuator is briefly electrically short-circuited immediately prior to adjusting the switching force chain made up of a valve-closure spring, an actuator and a hydraulic coupler, so that a possibly existing charge voltage is eliminated. Once the electrical connection between the connection element on the actuator and the valve-side plug terminal has been established, the latter is assigned a discharge resistor which is switched parallel to the actuator. The discharge resistor prevents a voltage potential from being applied at the plug terminal of the finished valve, which is disallowed for reasons of safety.

BRIEF SUMMARY OF THE INVENTION

The valve for metering fluid according to the present invention has the advantage that since the discharge resistor is provided as a fixed component in the piezoelectric actuator itself, the actuator is electrically discharged both during storage and installation, which ensures that no charge voltage is able to be generated in the actuator either during storage or installation. Without additional measures in the course of the installation process, e.g., the temporary short-circuiting of the actuator, a defined initial length of the actuator for the highly precise adjustment of the switching force chain thus is provided at all times. A subsequent occurrence of deviations in the size of the coupler gap of the hydraulic actuator, and thus of deviations in the metering accuracy of the valve, is therefore prevented. Furthermore, the discharge resistor integrated into the actuator makes the installation of the conventional discharge resistor at the plug terminal obsolete. The saved installation processes result in considerable cost savings.

According to one advantageous specific development of the present invention, the actuator has a piezo module made up of a piezo stack, situated between two cover plates, which includes a multitude of individual piezoelectric elements disposed axially one behind the other that are connected to two contact pins, and a bourdon tube which axially secures the cover plates relative to each other by clamping, as well as a contact member, which carries the connection elements and is fixed in place on one of the cover plates. This composition of the piezoelectric actuator, made up of a piezo module and a contact member fixed in place on the piezo module, simplifies the production of the piezoelectric actuator and offers a physically advantageous accommodation of the discharge resistor in the actuator.

According to one advantageous specific embodiment of the present invention, the connection elements are developed in the form of contact plates provided with connection lugs. The discharge resistor is connected to the contact plates, and the contact lugs are connected to one of the contact pins in each case. This construction design of the contact member simplifies the electrical connection of the actuator inserted into the valve housing at a plug connector situated on the valve housing.

DETAILED DESCRIPTION OF THE INVENTION

Figure 1:
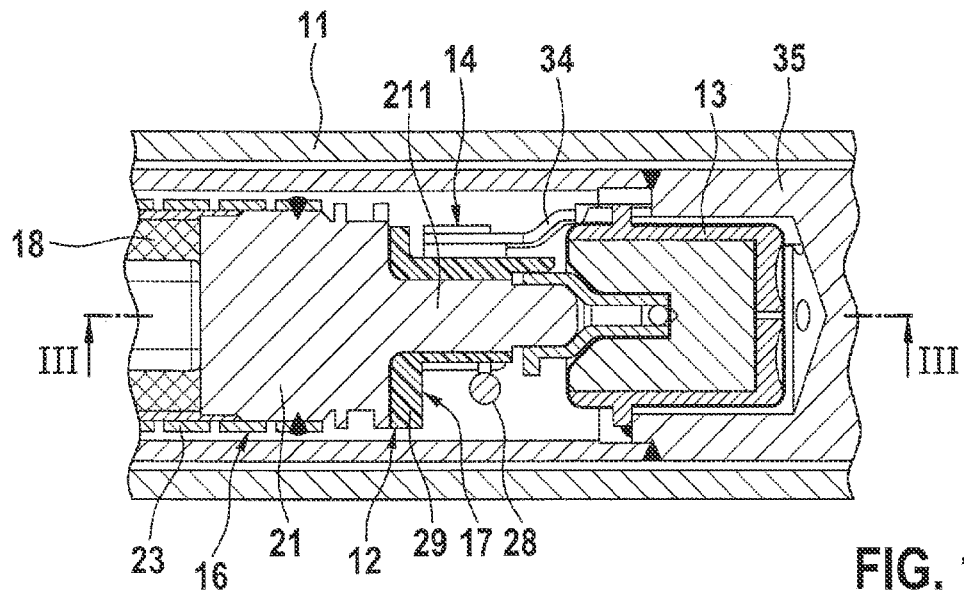
FIG. 1 shows in a cut-away view, a longitudinal section of a valve for metering fluid, having a piezoelectric actuator made up of a piezo module and a contact member.

The valve for metering fluid, shown in a cutaway view as longitudinal section in FIG. 1, is used as an injection valve for the injection of fuel in fuel-injection systems of internal combustion engines, for example. Fuel is to be understood as a fluid, that is to say, a liquid or gaseous fuel whose chemical energy is transformed into a driving force by combustion in an internal combustion engine, such as an Otto engine, a Diesel engine or a gas engine. A complete metering valve is described in DE 10 2007 028 490 A1, for instance.

The valve has a valve housing 11 provided with a metering orifice (not shown here), through which the fluid is metered, and a piezoelectric actuator 12 for the metering control. Piezoelectric actuator 12 is part of a so-called valve subassembly, which is inserted into valve housing 11. The valve subassembly includes a valve member (not shown here) for controlling the metering orifice; a valve-closure spring (not shown here) which loads the valve member in the valve closure direction; a piezoelectric actuator 12 for actuating the valve member counter to the restoring force of the valve-closure spring; and a hydraulic coupler 13 which is situated coaxially with respect to piezoelectric actuator 12. Piezoelectric actuator 12 and hydraulic coupler 13 are clamped between the valve member and a connecting piece 35 that seals valve housing 11 on the inflow side, and form a switching force chain for the valve member together with the valve-closure spring. For the application of an electrical control voltage to actuator 12, it is provided with two connection elements 14, 15.

Piezoelectric actuator 12 has a piezo module 16 and a contact member 17, which is fixedly joined to piezo module 16 and carries the two connection elements 14, 15. Piezo module 16, shown in FIG. 3 in the form of a longitudinal section, includes a piezo stack 18 made up of a multitude of individual piezoelectric elements (not shown) situated axially behind each other, which are connected to two contact pins 19, 20; two cover plates 21, 22 situated at the end faces of piezo stack 18; and a bourdon tube 23, which axially secures the two cover plates 21, 22 relative to each other by clamping, the bourdon tube generating a pressure force that is axially acting on piezo stack 18 by way of cover plates 21, 22. Connection elements 14, 15 are developed as contact plates 24, 25 provided with terminal lugs 26, 27, contact lugs 26, 27 being connected to the two contact pins 19, 20 in an electrically conductive manner. To ensure that piezo module 16, and thus actuator 12, has a defined initial length for adjustment of the switching force chain, which length has not changed during a storage period or as a result of pre-installation work, the two connection elements 14, 15 are bridged by a discharge resistor 28, which ensures the discharge state of actuator 12 and thus its always precise length. Discharge resistor 28 is connected to the two contact plates 24, 25 and has high impedance. Its size is a function of the capacitance of piezo stack 18 and the maximum control voltage applied at connection elements 14, 15. As an example and dependent upon these two quantities, discharge resistor 28 is dimensioned such that, two seconds after the control voltage has disappeared at connection elements 14, 15, the voltage still present at connection elements 14, 15 is no greater than 60 Volts.

Figure 2:
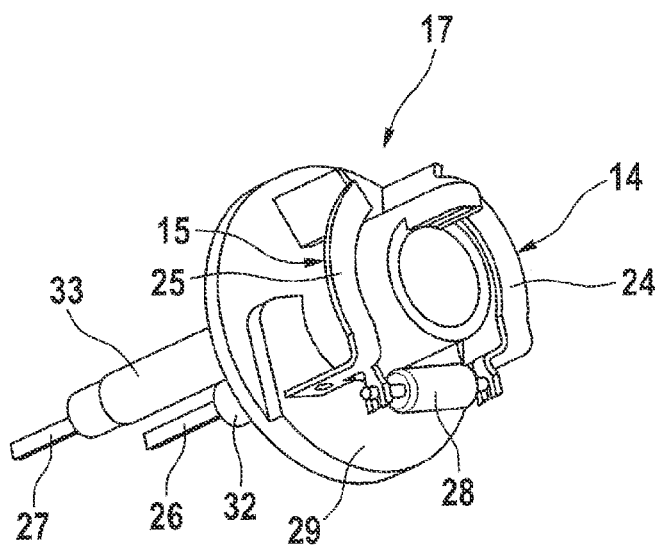
FIG. 2 shows a perspective view of the contact member of the piezoelectric actuator in FIG. 1.
Figure 3:
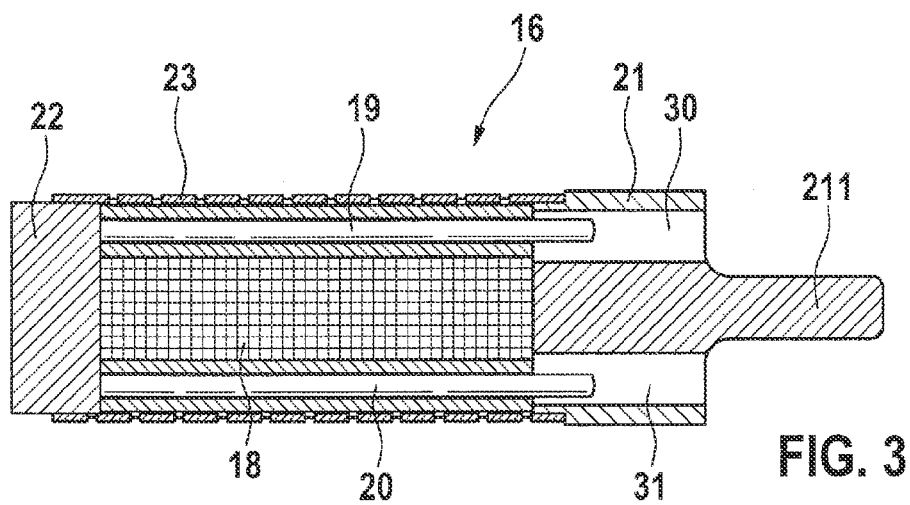
FIG. 3 shows a section of the piezo module along the line III-III in FIG. 1.

As can be gathered from FIGS. 2 and 3, cover plate 21 supporting contact member 17 has a central lug 211 directed away from piezo stack 18, and contact member 17 has a plastic body 29 which sits on top of lug 211 and is fixed in place thereon. Contact plates 24, 25 are situated on the side of plastic body 29 facing away from piezo stack 18, whereas contact lugs 26, 27 penetrate plastic body 29 and cover plate 21. Two axial bores 30, 31 are provided in cover plate 21 for this purpose, as can be gathered from the sectional view of piezo module 16 in FIG. 3. An individual contact lug 26 or 27 is guided through an axial bore 30 or 31 and connected to a contact pin 19 or 20 of piezo stack 18 via the lug end. In the region of axial bores 30, 31, contact lugs 26, 27 are sheathed by electrical insulation 32 or 33.

To apply an electrical control voltage at piezoelectric actuator 12, electric lines 34, which are routed to plug pins of an electric plug connection inside the valve housing, are contacted to contact plates 24, 25. One of the two electrical lines 34 can be seen in FIG. 1.

What is claimed is:

1. A valve for metering fluid, comprising:
a piezoelectric actuator for the metering control, wherein the piezoelectric actuator includes (i) two electrical connection elements for applying an electrical control voltage, and (ii) a discharge resistor integrated into the actuator and bridging the two connection elements.

2. The valve as recited in claim 1, wherein the piezoelectric actuator has a piezo module which includes:
a piezo stack made up of multiple individual piezoelectric elements situated axially behind each other and connected to two contact pins, the piezo stack being situated between two cover plates;
a bourdon tube which axially secures the two cover plates relative to each other by clamping; and
a contact member carrying the two connection elements, wherein the contact member is fixed in place on one of the two cover plates.

3. The valve as recited in claim 2, wherein:
the two connection elements are configured as two contact plates each having a respective contact lug;
the discharge resistor is connected to the two contact plates; and
the contact lugs are each connected to a respective one of the two contact pins of the piezo stack.

4. The valve as recited in claim 3, wherein:
the cover plate of the piezo module carrying the contact member has a central lug directed away from the piezo stack;
the contact member has a plastic body fixed in place on the central lug,
the two contact plates are situate on a side of the plastic body facing away from the piezo stack; and
the two contact lugs penetrate the plastic body and the cover plate.

5. The valve as recited in claim 4, wherein:
the two contact lugs each extend in a respective one of two axial bores penetrating the cover plate;
the two contact lugs are insulated in the region of the two axial bores; and
the two contact lugs are connected by lug ends to the two contact pins.

6. The valve as recited in claim 4, wherein the discharge resistor has high impedance.

* * * * *